(12) United States Patent
Lee

(10) Patent No.: US 8,168,526 B2
(45) Date of Patent: May 1, 2012

(54) SEMICONDUCTOR CHIP PACKAGE AND METHOD FOR MANUFACTURING THEREOF

(75) Inventor: Rae-Hyuk Lee, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 704 days.

(21) Appl. No.: 12/344,565

(22) Filed: Dec. 28, 2008

(65) Prior Publication Data
US 2009/0194874 A1    Aug. 6, 2009

(30) Foreign Application Priority Data
Dec. 28, 2007  (KR) .................. 10-2007-0139976

(51) Int. Cl.
*H01L 21/44* (2006.01)
(52) U.S. Cl. ............. 438/613; 257/737; 257/E23.021; 257/E21.508
(58) Field of Classification Search .......... None
See application file for complete search history.

(56) References Cited

U.S. PATENT DOCUMENTS

| | | | | |
|---|---|---|---|---|
| 5,593,927 A | * | 1/1997 | Farnworth et al. | 438/113 |
| 6,293,457 B1 | * | 9/2001 | Srivastava et al. | 228/254 |
| 2005/0269684 A1 | * | 12/2005 | Baek et al. | 257/691 |

FOREIGN PATENT DOCUMENTS

| | | |
|---|---|---|
| CN | 1722421 | 1/2006 |
| JP | 2007-067147 A | 3/2007 |
| KR | 1999-0005522 | 1/1999 |
| KR | 2004-0083192 | 10/2004 |
| KR | 2006-0109379 | 10/2006 |

* cited by examiner

*Primary Examiner* — Michelle Mandala
*Assistant Examiner* — Shaka Scarlett
(74) *Attorney, Agent, or Firm* — Sherr & Vaughn, PLLC

(57) ABSTRACT

A semiconductor chip package and a method for manufacturing thereof includes sequentially forming upper dielectric layer patterns and lower dielectric patterns over a substrate to expose an underlying metal line such that the lower dielectric layer patterns overlap the metal line, positioning a solder ball over and contacting the lower dielectric layer patterns such that the solder ball does not contact the metal line, and then placing the solder ball in a contacting position over the metal line by performing an etching process on the lower dielectric layer patterns. Therefore, no cracks occur on the chip pads so that there is no concern of short phenomenon generated in the terminal.

13 Claims, 3 Drawing Sheets

SEMICONDUCTOR CHIP PACKAGE AND METHOD FOR MANUFACTURING THEREOF

The present application claims priority under 35 U.S.C. §119 to Korean Patent Application No. 10-2007-0139976 (filed on Dec. 28, 2007), which is hereby incorporated by reference in its entirety.

BACKGROUND

Semiconductor fabrication technology has focused on obtaining highly integrated and lightweight semiconductor devices. The course of semiconductor package development has been changed from Dual-In-Line Package (DIP), Small-Out-Line (SO), Quad Flat Package (QEF) to Ball Grid Array (BGA) and Chip Size Package (CSP). In such progressed BGA and CSP packages, a solder ball is used instead of a lead in order to make a semiconductor package size as small as possible.

Figure 1:
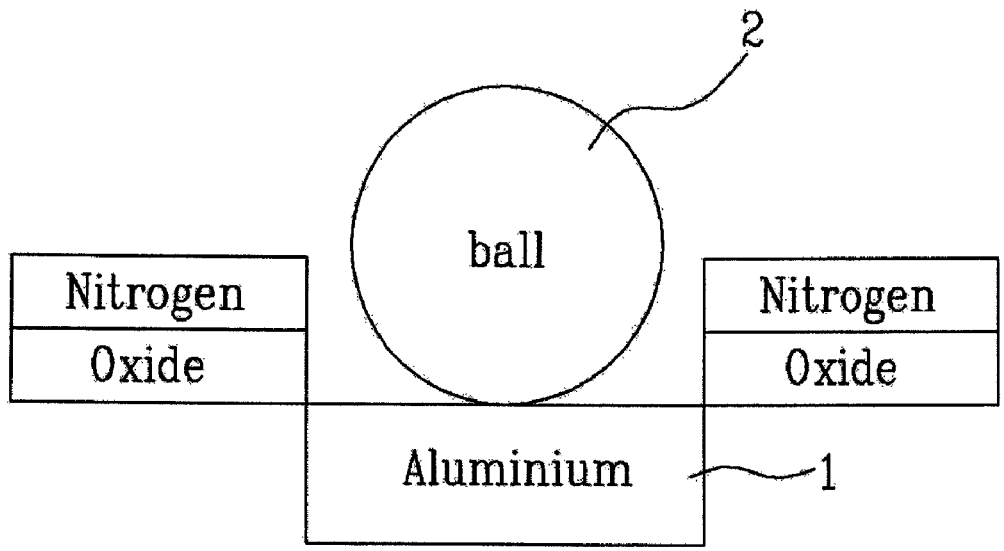

FIG. 1 is a view showing a method for manufacturing a semiconductor chip. When attaching a solder ball 2 to a semiconductor chip pad, the solder ball 2 is placed on an aluminum metal pad 1. Therefore, if excess pressure more than a standard strength is applied, a problem arises in that cracks occur on the chip pad. Such a crack, in turn, may generate an electrical short in the terminal.

SUMMARY

Embodiments relate to a semiconductor chip package and a method for manufacturing thereof that maximizes the junction characteristics of a solder ball.

Embodiments relate to a semiconductor chip package and a method for manufacturing thereof that changes the manner in which a solder ball is attached to a semiconductor chip pad.

Embodiments relate to a semiconductor chip package and a method for manufacturing thereof that minimizes cracks generated from a chip pad to which the solder ball is joined.

In accordance with embodiments, a semiconductor chip package may include at least one of the following: a chip pad formed on and/or over a chip surface; a metal line formed in a substrate of the chip pad; a multi-layer dielectric layer formed on and/or over the chip surface by exposing the metal line; and a solder ball placed at an edge portion of a bottom layer of the multi-layer dielectric layer which contacts the metal line.

In accordance with embodiments, a semiconductor chip package may include at least one of the following: a chip pad including a substrate; a metal line formed in the substrate; a multi-layer dielectric layer pattern including a first dielectric layer pattern formed over and overlapping the metal line and a second dielectric layer pattern formed over the first dielectric layer pattern to expose the metal line such that edge portions of the first dielectric layer pattern formed overlapping the metal line have rounded cross-sections; and a solder ball placed at the edge portions of the first dielectric layer pattern to contact the metal line.

In accordance with embodiments, a method may include at least one of the following: forming a chip pad including a substrate; and then forming a metal line in the substrate; and then forming a multi-layer dielectric layer pattern over the substrate including a first dielectric layer pattern formed over and overlapping the metal line and a second dielectric layer pattern formed over the first dielectric layer pattern to expose the metal line; and then placing a solder ball over the metal line to contact corner edge portions of the first dielectric layer pattern but not contact the metal line; and then etching the corner edge portions of the first dielectric layer pattern such that the solder ball contacts the metal line.

In accordance with embodiments, a method may include at least one of the following: forming a metal line in a substrate; and then sequentially forming upper dielectric layer patterns and lower dielectric patterns spaced apart over the substrate to expose the metal line such that the lower dielectric layer patterns overlap the metal line; and then positioning a solder ball over and contacting the lower dielectric layer pattern such that the solder ball does not contact the metal line; and then placing the solder ball in a contacting position over the metal line by performing an etching process on the lower dielectric layer patterns.

In accordance with embodiments, a method for manufacturing a semiconductor chip package may include at least one of the following: forming a chip pad on and/or over a chip surface; forming a metal line in a substrate of the chip pad; forming a multi-layer dielectric layer exposing the metal line on and/or over the chip surface; placing a solder ball at an edge portion of a bottom layer of the multi-layer dielectric layer; and then etching the bottom layer so that the solder ball contacts the metal line.

In accordance with embodiments, forming the multi-layer dielectric layer may include at least one of the following: forming a first dielectric layer corresponding to the bottom layer on and/or over the chip surface; planarizing the first dielectric layer; forming a second dielectric layer on and/or over the planarized first dielectric layer; and then selectively etching the first and second dielectric layers so that the metal line is exposed.

DRAWINGS

FIG. 1 is a view showing processes of a method for manufacturing a semiconductor chip.

Figure 2:
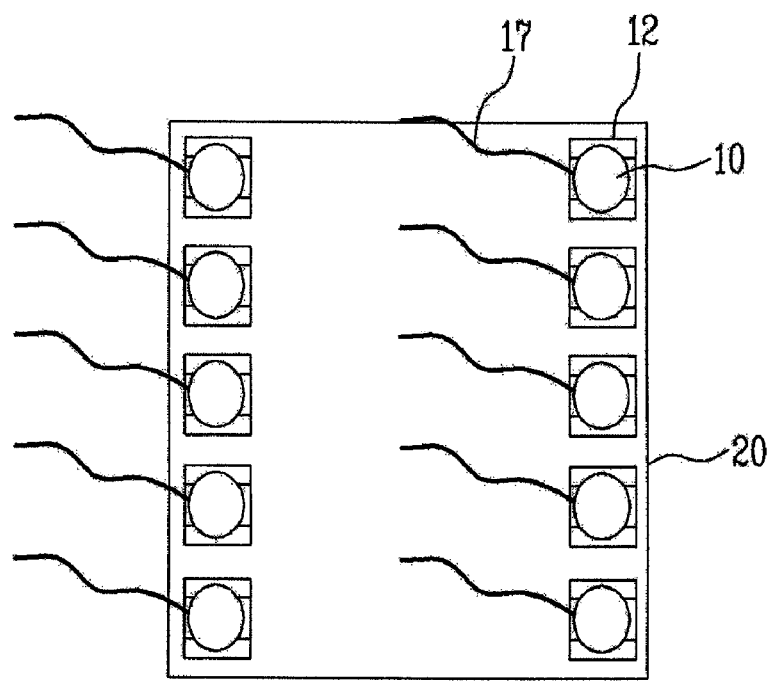
Figure 3A:
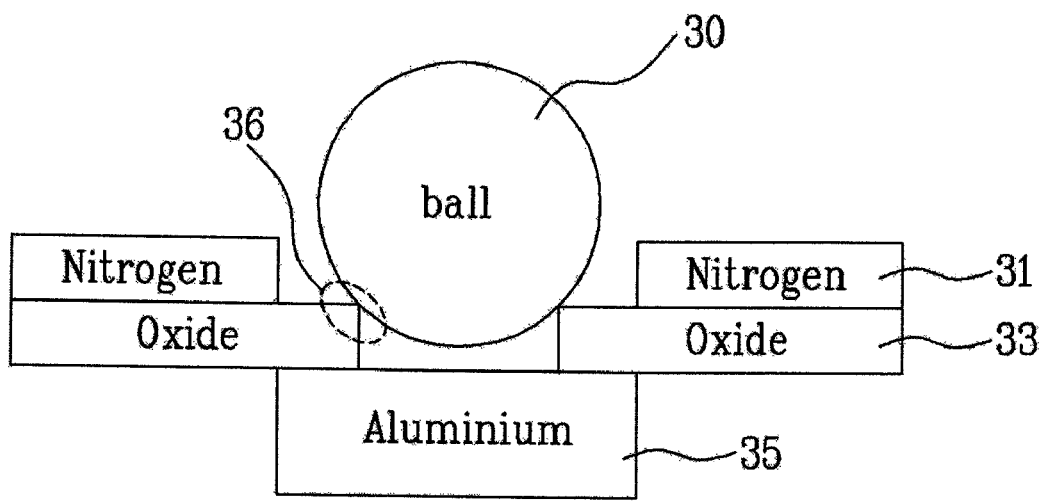
Figure 3B:
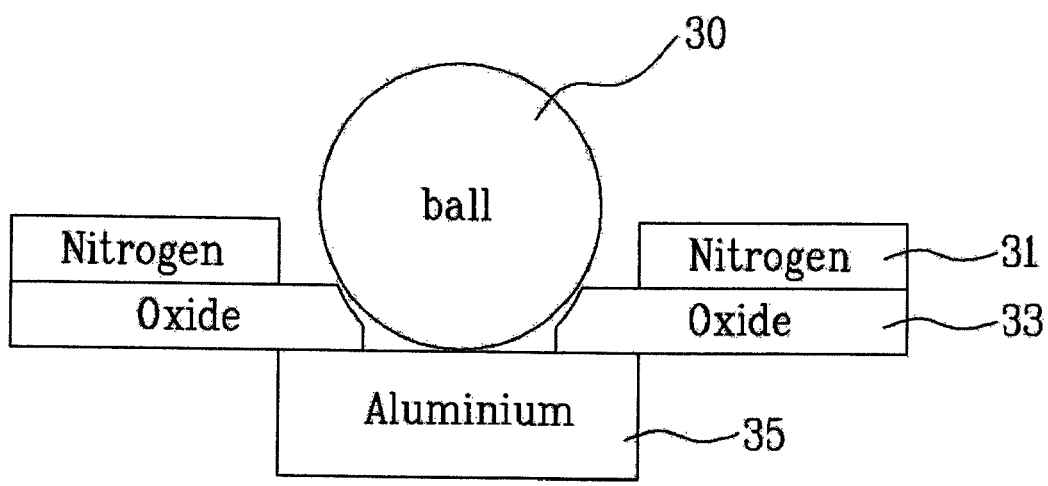
Figure 4:
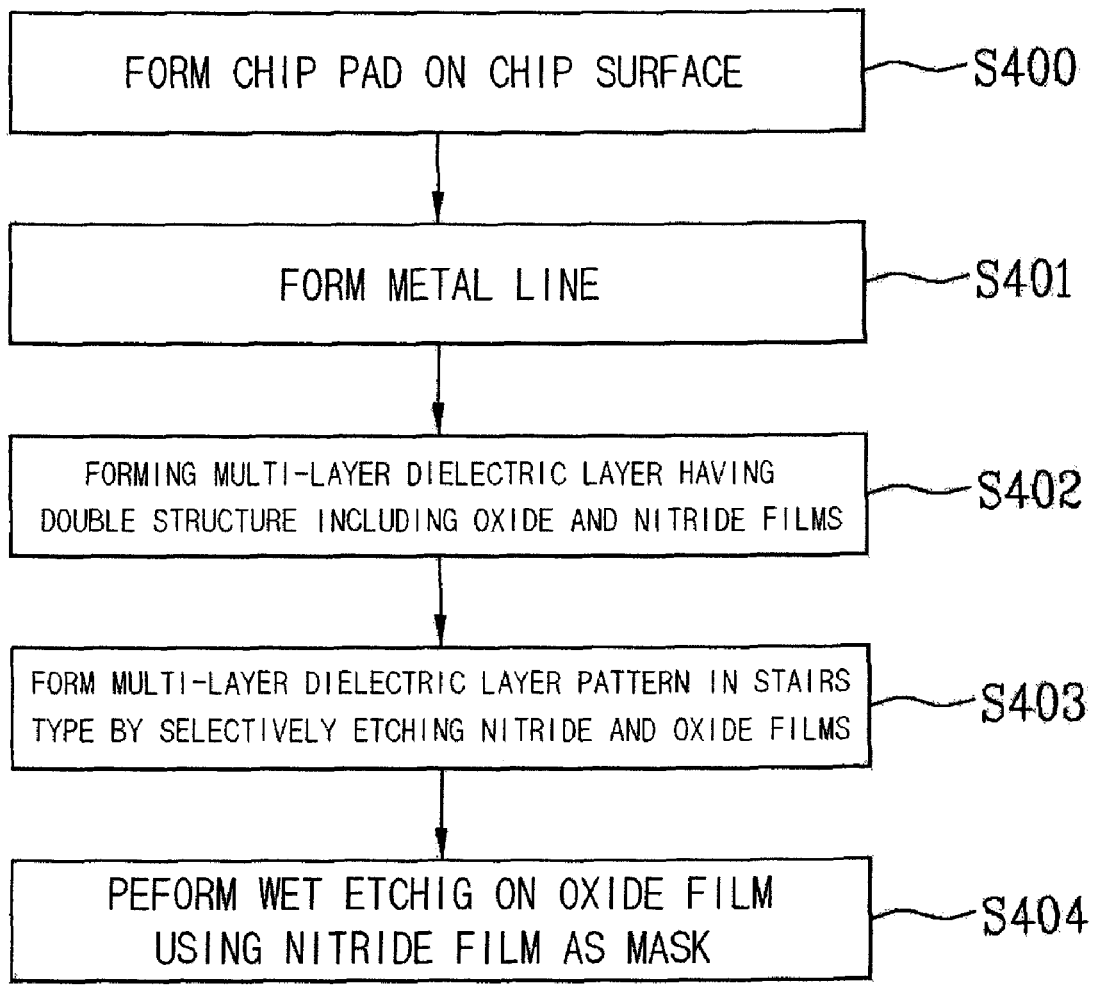

Example FIGS. 2 to 4 illustrate semiconductor chip packages and a method for manufacturing a semiconductor chip package in accordance with embodiments.

DESCRIPTION

Example FIG. 2 illustrates according to the present invention. Referring to FIG. 2, a semiconductor chip package structure in accordance with embodiments may include chip pad 12 and bonding wire 17 provided on and/or over semiconductor chip 20, and solder ball 10 provided and/or over chip pad 12. Metal lines are formed on and/or over substrates of each chip pad 12. A multi-layer dielectric layer is provided on and/or over an active surface of the semiconductor chip 20 including chip pads 12 exposing the metal lines of the chip pads 12. One end of bonding wire 17 is attached to solder ball 10 while the other end of bonding wire 17 is laterally bent to face upwardly from the multi-layer dielectric layer. Solder ball 10 is placed at an edge portion of a bottommost layer of the multi-layer dielectric layer. Solder ball 10 is naturally sunken to contact the metal line while the bottommost dielectric layer is etched. When solder ball 10 is formed at the bottommost dielectric layer, the other end of the bonding wire 17 is inserted into solder ball 10.

Example FIG. 3A is a cross-sectional views showing a semiconductor chip package in accordance with embodiments before a solder ball 30 contacts a metal line 35. Referring to example FIG. 3A, the semiconductor chip in accordance with embodiments includes a chip pad, metal line 35 formed in a substrate of the chip pad, multi-layer dielectric layer pattern 31, 33 formed on and/or over the chip surface and exposing metal line 35, and solder ball 30. A plurality of chip pads are formed on and/or over the chip surface of the semiconductor chip, as shown in example FIG. 2. Metal line 35 may be composed of aluminum (Al) and is formed in the substrates of each chip pad.

Multi-layer dielectric layer pattern 31, 33 is formed having a double structure of oxide film pattern 33 formed at the bottom and nitride film 31 formed on and/or over oxide film 33. In particular, as shown in example FIG. 3A, multi-layer dielectric layer pattern 31, 33 is formed such that a portion of oxide film pattern 33 corresponding to the bottom layer overlaps metal line 35 to expose a portion of the metal line 35. Meaning, the width of nitride film pattern 31 is less than the width of oxide film pattern 33. Nitride film pattern 31, which serves as the uppermost dielectric layer, has an opening equal to the width of metal line 35. Therefore, owing to the differences in widths between oxide film pattern 33 and nitride film pattern 31, the multi-layer dielectric layer 31, 33 having an overlapping structure is formed.

The openings of multi-layer dielectric layer 31, 33 are formed through a selective etching. Multi-layer dielectric layer 31, 33 each may be formed by performing a pad open patterning process after both oxide film 33 and nitride film 31 are formed. Alternatively, the first oxide film 33 is first formed and then a pad open etching process is performed in order that a portion of oxide film 33 overlaps metal line 35. Then nitride film 31 is formed and then a pad open etching process of forming an opening with a width greater than the opening of oxide film 33 is performed, thereby making it possible to form multi-layer dielectric film 31, 33. The width of the opening of oxide film pattern 33 is smaller than the diameter of solder ball 30 such that solder ball 30 contacts an edge portion 36 of oxide film pattern 33 but does not contact the underlying meta layer 35, as shown in example FIG. 3A. The edge portion 36 in contact with the solder ball 30 is removed by performing a wet etching on oxide film pattern 33 such that solder ball 30 drops from its original position to thereby directly physically contact metal line 35.

Example FIG. 3B is a cross-sectional views showing a semiconductor chip package structure in accordance with embodiments whereby solder ball 30 contacts metal line 35 as a portion of oxide film pattern 33 is removed by performing a wet etching. Solder ball 30 contacts metal line 35 by performing a wet etching on oxide film pattern 33, completing the semiconductor chip package. As described above, oxide film pattern 33 initially functions as a buffer to prevent contact between solder ball 30 and metal line 35 directly. Thereafter a wet etching is performed on oxide film pattern 33 to permit contact between solder ball 30 metal line 35 without pressing.

The width and length of metal line 35 may be approximately 50 μm, respectively, and the diameter of the solder ball 30 may be approximately 50 μm. The thickness of oxide film 33 and nitride film 31 may be approximately 1 μm, respectively. Meanwhile, the overlapped width between oxide film 33 and metal wire 35 may be approximately 22 μm from both sides in order that solder ball 30 does not initially contact metal line 35. In other words, oxide film 33 must be extended on and/or over metal line 35 by about 2×22 μm compared to the nitride film 31. Therefore, the width of the opening of the oxide film 33 exposing the metal line 35 is preferably about 66 μm.

Example FIG. 4 is a flowchart showing a method for manufacturing a semiconductor chip package in accordance with embodiments. Referring to example FIG. 4, first a chip pad is formed on and/or over a semiconductor chip surface (S400). Metal line 35 is then formed in a substrate of the chip pad (S401). A multi-layer dielectric layer having a double-layered structure of a bottommost layer of oxide film 33 and an uppermost layer of nitride film 31 formed on and/or over oxide film 33, is formed on and/or over the chip surface on and/or over which metal line 35 is formed (S402). More specifically, oxide film 33 is formed on and/or over the chip surface as a first dielectric layer corresponding to the bottommost layer, and oxide film 33 is then planarized. Nitride film 31 is then formed on and/or over the planarized oxide film 33 as a second dielectric layer.

After the multi-layer dielectric layer is formed, nitride film 31 and oxide film 33 are selectively etched to expose metal line 35. In particular, nitride film 31 and oxide film 33 are selectively etched to form a multi-layer dielectric layer pattern in an overlapping structure (i.e., stair type) (S403). In the etching for forming the multi-layer dielectric layer in stairs type, the width of the nitride film to be etched is preferably greater than the width of the oxide film to be etched, and the width of the oxide film to be etched is also preferably smaller than the diameter of solder ball 30. The width of nitride film 31 to be etched is preferably the same as the width of metal line 35. Thereafter, oxide file 33 corresponding to the bottommost layer of the multi-layer dielectric layer pattern functions as a buffer to prevent initial contact between solder ball 30 and metal line 35 by supported solder ball 30 at an edge portion thereof. A wet etching is performed on oxide film 33 so that solder ball 30 is sunken to contact metal line 35 (S404). The wet etching is performed using nitride film 31 as a mask. As a portion of oxide film 33 is removed by performing a wet etching on oxide film 33, solder ball 30 contacts metal line 35. A cleaning process is then performed after the wet etching, wherein a HOT SC1 process is used as the cleaning process.

Solder ball 30 is an external connection terminal of a semiconductor chip package corresponding to an external connection pin of a pin Insert-type semiconductor chip package and an external lead line of a Surface mount-type semiconductor chip package. Solder ball 30 is formed on and/or over the chip surface through a redistribution process at the time of manufacturing a wafer.

As described above, in accordance with embodiments, oxide film 33 functions as a buffer before etching so that solder ball 30 does not initially contact the metal line directly, and then, a wet etching is performed on oxide film 33 so that solder ball 30 contacts metal line 35 naturally without pressing. Thereby, no cracks occur on the chip pads so that there is no concern of short phenomenon generated in the terminal.

In manufacturing a chip size package (CSP), embodiments changes a structure that the solder ball is joined directly on the chip pad so that no chip cracking occurs even though pressure more than a standard strength is applied. Therefore, there is no concern that short phenomenon generated in the terminal. Also, embodiments removes the possibility that cracking occurs in the semiconductor chip pad when the solder ball is attached, making it possible to maximize the solder junction characteristics and prevent the short phenomenon generated in the terminal.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
 forming a chip pad including a substrate; and then
 forming a metal line in the substrate; and then
 forming a multi-layer dielectric layer pattern over the substrate including a first dielectric layer pattern formed over and overlapping the metal line and a second dielectric layer pattern formed over the first dielectric layer pattern to expose the metal line; and then
 placing a solder ball over the metal line to contact corner edge portions of the first dielectric layer pattern but not contact the metal line; and then
 etching the corner edge portions of the first dielectric layer pattern such that the solder ball contacts the metal line.

2. The method of claim 1, wherein etching the corner edge portions comprises etching the corner edge portions such to have rounded cross-sections.

3. The method of claim 1, wherein forming the multi-layer dielectric layer pattern comprises:
 forming a first dielectric layer over the substrate including the metal line; and then
 planarizing the first dielectric layer; and then
 forming a second dielectric layer over the first dielectric layer; and then
 selectively etching the first and second dielectric layers to expose the metal line.

4. The method of claim 3, wherein the first dielectric layer is selectively etched by a wet etching process using the second dielectric layer as a mask.

5. The method of claim 3, wherein the first dielectric layer is composed of an oxide film.

6. The method of claim 3, wherein the second dielectric layer is composed of a nitride film.

7. The method of claim 3, wherein selectively etching the first and second dielectric layers comprises forming a first opening in the first dielectric layer exposing the metal line and a second opening in the second dielectric layer exposing the metal line such that the first opening has a width less than the width of the second opening.

8. The method of claim 7, wherein the width of the second opening is the same as the width of the metal line.

9. The method of claim 7, wherein the width of the first opening is less than the diameter of the solder ball.

10. The method of claim 1, wherein the metal line is composed of aluminum (Al).

11. A method comprising:
 forming a metal line in a substrate; and then
 sequentially forming upper dielectric layer patterns and lower dielectric patterns over the substrate to expose the metal line such that the lower dielectric layer patterns overlap the metal line; and then
 positioning a solder ball over and contacting the lower dielectric layer patterns such that the solder ball does not contact the metal line; and then
 placing the solder ball in a contacting position over the metal line by performing an etching process on the lower dielectric layer patterns.

12. The method of claim 11, wherein sequentially forming upper dielectric layer patterns and lower dielectric patterns comprises:
 forming a lower dielectric layer over the substrate including the metal line; and then
 planarizing the lower dielectric layer; and then
 forming an upper dielectric layer over the lower dielectric layer; and then
 forming the upper dielectric patterns by performing a first etching process on the upper dielectric layer; and then
 forming the lower dielectric patterns by performing a second etching process on the lower dielectric layer.

13. The method of claim 12, wherein the second etching process is a wet etching process and the wet etching process is performed using the upper dielectric layer patterns as masks.

* * * * *